United States Patent
Lei et al.

(10) Patent No.: US 7,279,369 B2
(45) Date of Patent: Oct. 9, 2007

(54) GERMANIUM ON INSULATOR FABRICATION VIA EPITAXIAL GERMANIUM BONDING

(75) Inventors: Ryan Lei, Hillsboro, OR (US); Mohamad A. Shaheen, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 40 days.

(21) Appl. No.: 10/646,681

(22) Filed: Aug. 21, 2003

(65) Prior Publication Data

US 2005/0042842 A1  Feb. 24, 2005

(51) Int. Cl.
*H01L 21/00* (2006.01)

(52) U.S. Cl. ............. 438/149; 438/455; 438/DIG. 933; 257/E21.092; 257/E21.127

(58) Field of Classification Search ................ 438/149, 438/311, 455, 479, 933, 964, 967; 257/E21.092, 257/E21.102, E21.122, E21.127
See application file for complete search history.

(56) References Cited

U.S. PATENT DOCUMENTS

| | | | | |
|---|---|---|---|---|
| 3,997,381 | A * | 12/1976 | Wanlass | 438/10 |
| 4,370,510 | A * | 1/1983 | Stirn | 136/262 |
| 4,601,779 | A * | 7/1986 | Abernathey et al. | 438/459 |
| 4,891,329 | A * | 1/1990 | Reisman et al. | 438/459 |
| 5,603,779 | A | 2/1997 | Linn et al. | |
| 5,882,987 | A | 3/1999 | Srikrishnan | |
| 6,501,135 | B1 * | 12/2002 | Krivokapic | 257/354 |
| 6,569,748 | B1 * | 5/2003 | Sakaguchi et al. | 438/455 |
| 6,576,532 | B1 * | 6/2003 | Jones et al. | 438/481 |
| 6,645,829 | B2 * | 11/2003 | Fitzergald | 438/455 |
| 6,677,655 | B2 * | 1/2004 | Fitzergald | 257/432 |
| 6,680,495 | B2 * | 1/2004 | Fitzergald | 257/183 |
| 6,833,195 | B1 * | 12/2004 | Lei et al. | 428/458 |
| 6,933,566 | B2 * | 8/2005 | Bojarczuk et al. | 257/347 |
| 2002/0040983 | A1 * | 4/2002 | Fitzgerald | 257/183 |
| 2002/0052061 | A1 * | 5/2002 | Fitzgerald | 438/46 |
| 2002/0066899 | A1 * | 6/2002 | Fitzgerald, Jr. | 257/11 |
| 2002/0185685 | A1 * | 12/2002 | Ju et al. | 257/347 |
| 2004/0072409 | A1 * | 4/2004 | Fitzgerald et al. | 438/455 |
| 2004/0150006 | A1 * | 8/2004 | Aulnette et al. | 257/200 |

FOREIGN PATENT DOCUMENTS

WO   WO 2004100268 A1 * 11/2004

OTHER PUBLICATIONS

Glinsner, T., et al., "Reversible and Permanent Wafer Bonding for GaAs Processing," GaAs MANTECH, Inc., 2001, 4 pages.
Sze, S.M., et al., "Physics of Semiconductor Devices," John Wiley & Sons, 1981, Appendix H, 4 pages.

* cited by examiner

*Primary Examiner*—Michael Lebentritt
*Assistant Examiner*—Stanetta Isaac
(74) *Attorney, Agent, or Firm*—Blakely, Sokoloff, Taylor & Zafman LLP

(57) ABSTRACT

A method of forming a germanium-on-insulator (GOI). An epitaxial germanium layer is formed on top of a first substrate. A first dielectric film is formed on top of the epitaxial germanium layer. A second substrate is provided. The first substrate is bonded to the second substrate by bonding the first dielectric film to the second substrate. The bonding resulted in a bonded wafer pair. The first substrate is removed after the bonding to expose epitaxial germanium layer to form the GOI substrate.

37 Claims, 7 Drawing Sheets

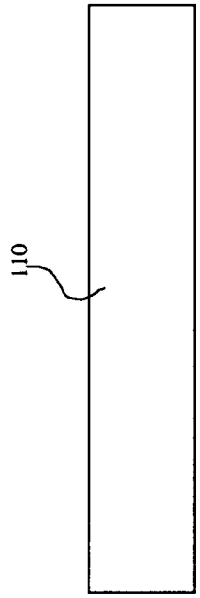
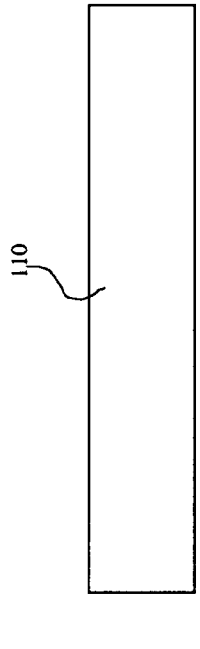
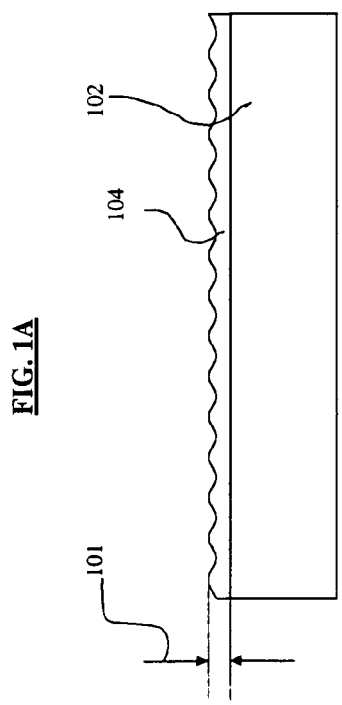
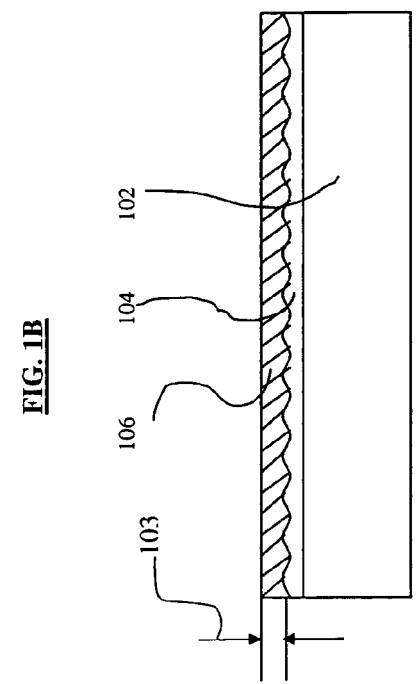
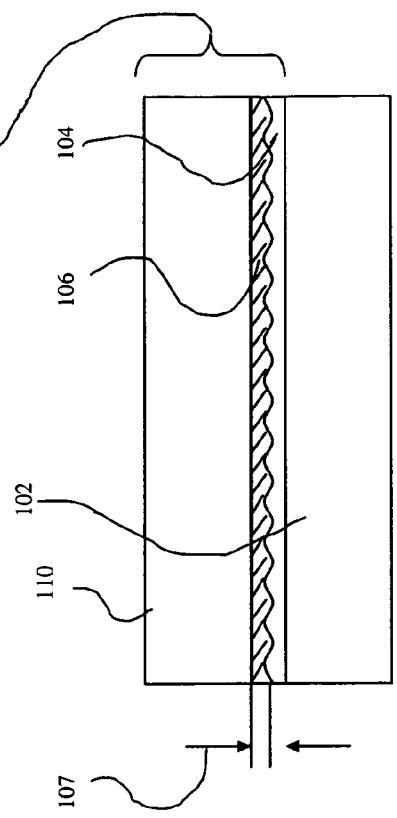

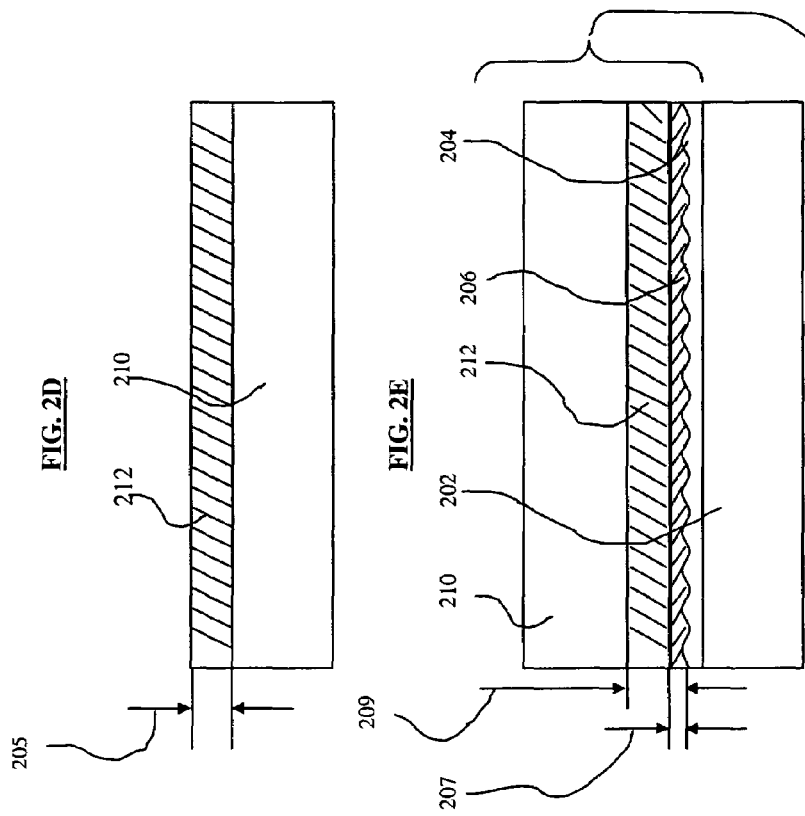

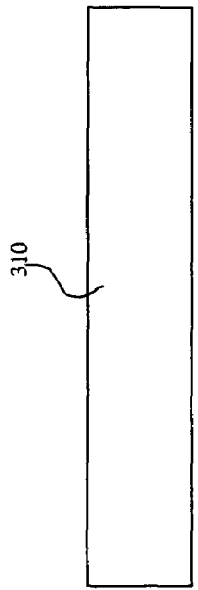
FIG. 3A
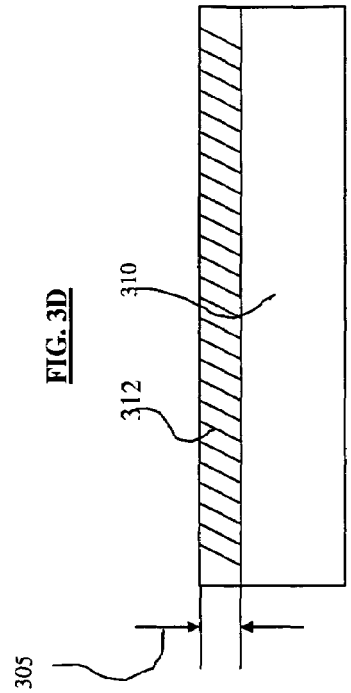
FIG 3B
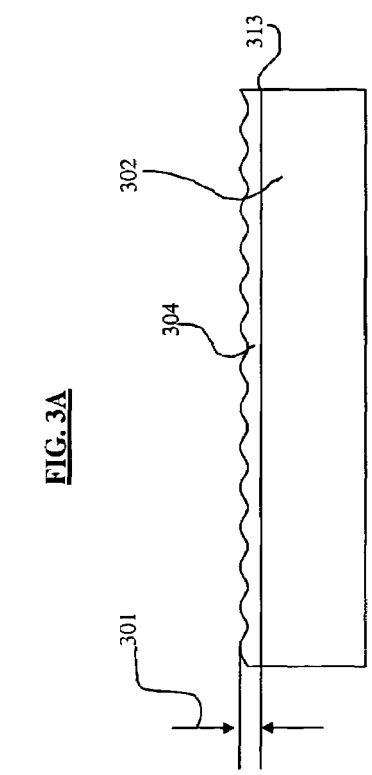
FIG. 3C
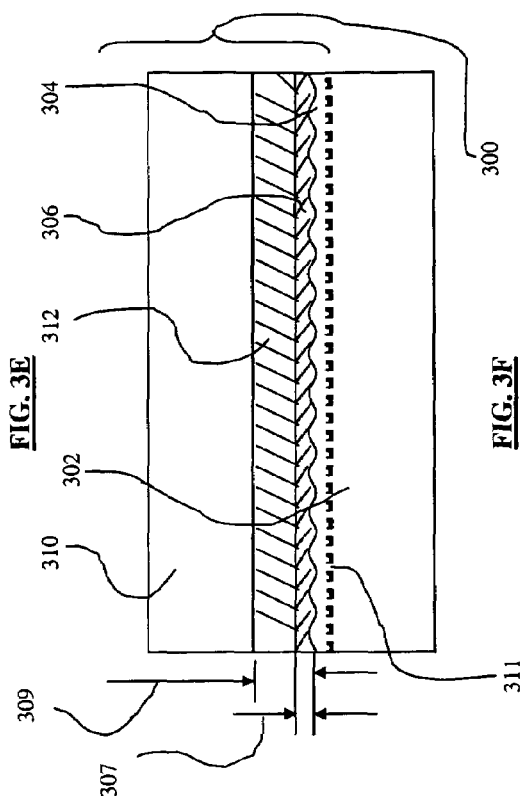
FIG. 3D
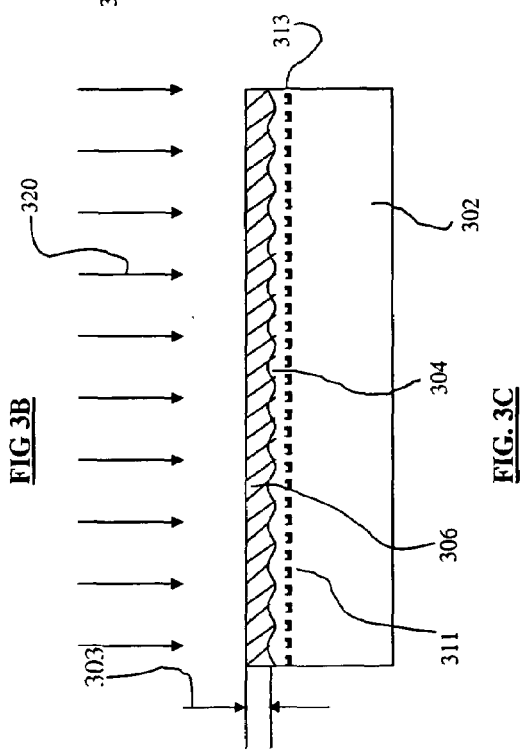
FIG. 3E
FIG. 3F

GERMANIUM ON INSULATOR FABRICATION VIA EPITAXIAL GERMANIUM BONDING

BACKGROUND

1. Field

This disclosure pertains to a method of fabricating a germanium-on-insulator (GOI) substrate and a method of bonding an epitaxial germanium layer to a semiconductor substrate to form a GOI substrate.

2. Discussion of Related Art

There is an increasing interest in using silicon-germanium (Si—Ge) alloy as a material for microelectronic and optoelectronic device applications. Germanium (Ge) is known to have high carrier mobility (e.g., high hole and electron mobility) and optical absorption as compared to silicon (Si). This is one reason why Ge is useful for devices that require enhanced performance and/or high quantum efficiency. Embodiments of devices that would benefit from the use of a Ge film include metal-oxide-semiconductor (MOS) transistors, optical detectors, and other optoelectronic devices, to name a few. There is also an increasing interest in bonding a germanium layer onto an insulator that is formed on a semiconductor substrate to form the GOI because the insulator layer in the semiconductor substrate helps reducing current leakage in the semiconductor device that is formed in the germanium layer.

There are generally two methods for forming a GOI substrate. In the first method, a crystalline Ge donor wafer is transferred (or bonded) onto a semiconductor wafer handle having an insulation layer. Ion exfoliation is then used to remove portions of the Ge donor wafer to leave a Ge layer bonded to the semiconductor wafer. Using a crystalline Ge donor wafer to transfer Ge onto a wafer handle is costly. For instance, the crystalline Ge donor must be polished to the desired thickness which is time consuming and expensive. It is thus difficult and costly to remove surface non-uniformity after the ion exfoliation.

In the second method, an epitaxial Ge layer is formed on top of a semiconductor wafer handle having an insulation layer. Currently, an epitaxial Ge layer cannot be directly bonded to a wafer handle due to the high roughness inherent in the Ge layer. Direct wafer bonding requires smooth surfaces of about <0.5 nm to <1.5 nm RMS roughness. An epitaxial germanium (Ge) layer usually has a roughness of about >2 nm RM to >4 nm RMS. Such roughness in an epitaxial Ge layer makes direct bonding of the Ge layer to an insulator on a semiconductor substrate (or wafer handle) difficult. In addition, to treat the surface of the epitaxial Ge so as to provide it with a smooth surface is difficult and expensive. For example, chemical mechanical polishing of an epitaxial Ge layer surface is time consuming.

There is thus a need for a new method of forming a GOI substrate.

BRIEF DESCRIPTION OF THE DRAWINGS

The disclosure is illustrated by way of embodiment and not by way of limitation in the figures of the accompanying drawings in which like references indicate similar elements. The invention may best be understood by referring to the following description and accompanying drawings that are used to illustrate embodiments of the invention. In the drawings:

FIGS. 1A-1E illustrate an exemplary GOI substrate at various stages of fabrication;

FIGS. 2A-2F illustrate another exemplary GOI substrate at various stages of fabrication;

FIGS. 3A-3F illustrate another exemplary GOI substrate at various stages of fabrication;

DETAILED DESCRIPTION OF THE PRESENT INVENTION

Figure 4:
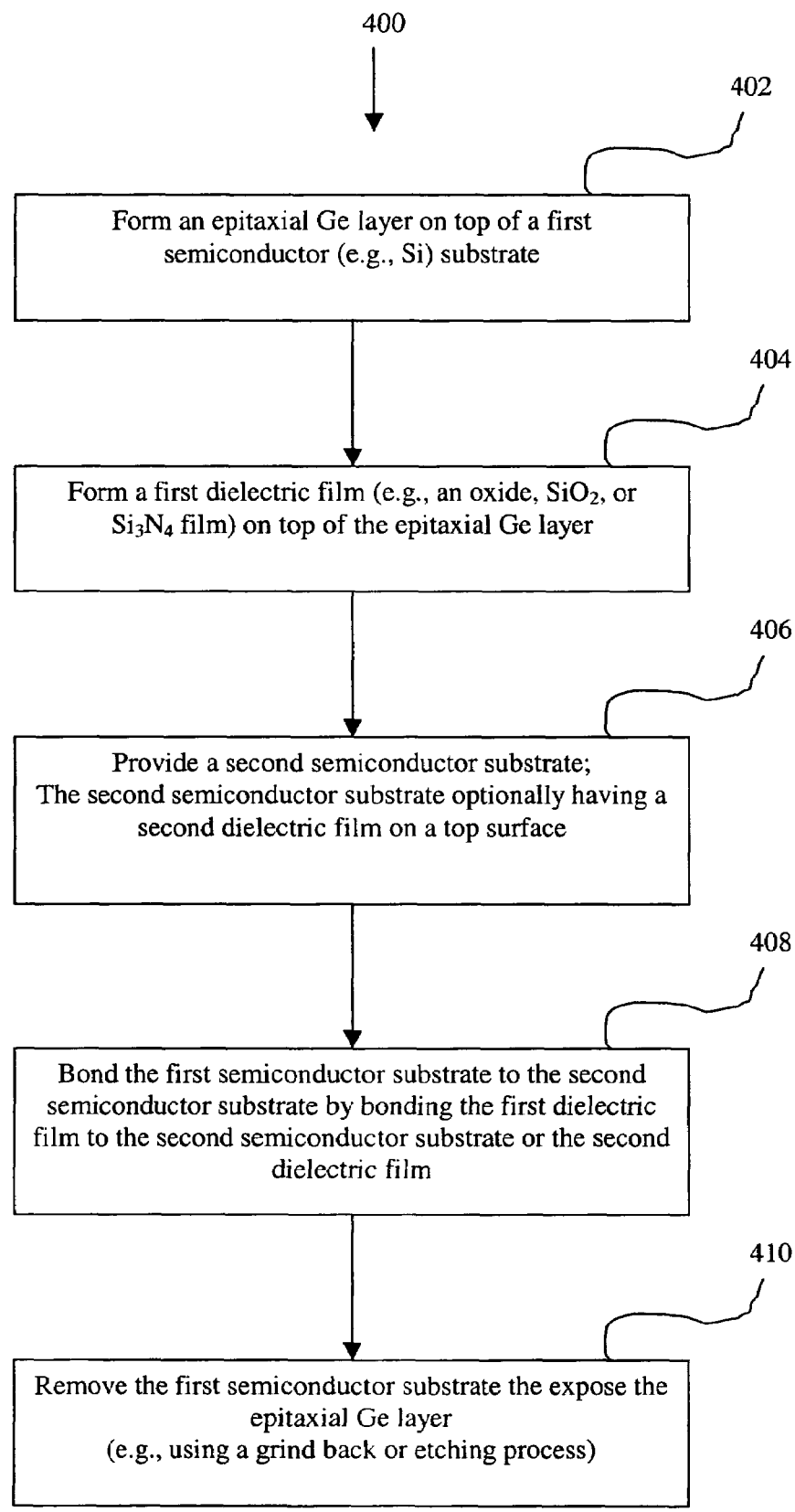
FIG. 4 illustrates an exemplary method of bonding an epitaxial Ge layer to a semiconductor substrate wafer in accordance to the embodiments of the present invention.

Exemplary embodiments are described with reference to specific configurations and techniques. Those of ordinary skill in the art will appreciate the various changes and modifications to be made while remaining within the scope of the appended claims. Additionally, well known elements, devices, components, circuits, process steps and the like are not set forth in detail.

The embodiments of the present invention direct to methods of forming a germanium-on-insulator (GOI) substrate. Throughout the disclosure, the term "bonded wafer pair" refers to a first semiconductor substrate having an epitaxial germanium layer formed thereon being bonded to a second semiconductor substrate. The first semiconductor substrate is bonded to a second semiconductor substrate through at least one dielectric layer. The term "semiconductor substrate" used in this disclosure includes a Si substrate, a Si-containing substrate, a Si substrate having an oxide layer (e.g., silicon dioxide), or a silicon-on-insulator (SOI) substrate. The silicon substrate may be monocrystalline, polycrystalline, or bulk silicon. The term "semiconductor substrate" may also include other material typically used to fabricate semiconductor devices such as gallium arsenide.

It is difficult to form a crystalline germanium layer on a dielectric layer. A dielectric layer is typically amorphous and as such, it is difficult for a crystalline germanium layer to form thereon. Even if a germanium layer can be formed on a dielectric layer, it will be amorphous and lacking any crystalline structure. It is also difficult to bond an epitaxial germanium film onto a dielectric layer due to the inherent roughness of the epitaxial germanium film. The embodiments disclose methods of forming a GOI substrate that does not require bonding a germanium film onto a semiconductor substrate and does not required growing a germanium film on a dielectric layer. The embodiments disclose methods of forming a GOI substrate that includes forming a dielectric layer on an epitaxial germanium and then bonding that dielectric layer onto another surface to form the GOI substrate.

In one embodiment, an epitaxial Ge layer is formed on a first semiconductor substrate (e.g., Si substrate). The epitaxial Ge layer has a rough surface generally about 2 nm or greater than 2 nm RMS roughness. A first dielectric layer (e.g., silicon dioxide ($SiO_2$) or silicon nitride ($Si_3N_4$)) is formed over the epitaxial Ge layer, over the rough surface. The first dielectric layer conforms to the roughness pattern in the epitaxial Ge layer. The first dielectric layer is sufficiently thick to cover the roughness in the epitaxial Ge layer. A second semiconductor substrate (e.g., Si substrate) is provided. The first and the second semiconductor substrates are bonded together in a way that the first dielectric layer formed over the epitaxial Ge layer is bonded to a clean surface of the second semiconductor substrate. After the bonding, the first semiconductor substrate is removed and the structure remained is a GOI substrate. The GOI substrate includes the second semiconductor substrate, the dielectric layer, and the epitaxial Ge layer.

In an alternative embodiment, the second semiconductor substrate includes a second dielectric layer. When the first semiconductor substrate and the second semiconductor substrate are bonded together, the first dielectric layer and the second dielectric layer are directly bonded to each other. After the bonding, the first semiconductor substrate is removed and the structure remained is a GOI substrate. The GOI substrate includes the second semiconductor substrate, the first and second dielectric layers, and the epitaxial Ge layer.

FIGS. 1A-1E illustrate various stages of forming a GOI substrate 100 in accordance with some embodiments of the present invention. In FIG. 1A, a first semiconductor substrate 102 is provided. The first semiconductor substrate 102 can be any suitable material that an epitaxial Ge layer can be formed thereon and be removed from. The semiconductor substrate 102 is typically a Si wafer. It is to be appreciated that the Si wafer may be replaced by other suitable semiconductor substrate such as Ge and gallium arsenide.

In FIG. 1B, an epitaxial Ge layer 104 is formed on top of the first semiconductor substrate 102. In one embodiment, the epitaxial Ge layer 104 has a surface with a roughness approximately greater than 2 nm RMS. In another embodiment, the epitaxial Ge layer 104 has a surface with a roughness approximately greater than 4 nm RMS. The epitaxial Ge layer 104 has a thickness 101 that may be less than 3000 Å. In some embodiment, the epitaxial Ge layer 104 has a thickness 101 ranging from about 100-4000 Å. The epitaxial Ge layer 104 can be formed using conventional methods such as chemical vapor deposition (CVD) or plasma enhanced CVD as is known in the art. In one embodiment, a germanium gas source (e.g., germane) is floated over the substrate 102, which creates a gas phase reaction with the surface of the first semiconductor substrate 102. The epitaxial Ge layer 104 is formed on the surface of the first semiconductor substrate 102 as a result of the gas phase reaction.

In FIG. 1C, a dielectric layer 106 is formed over the epitaxial Ge layer 104. As shown in FIG. 1B, the surface of the epitaxial Ge layer 104 is rough and thus difficult for a direct wafer bonding to the epitaxial Ge layer 104. Forming the dielectric layer 106 over the epitaxial Ge layer 104 covers the rough surface on the epitaxial Ge layer 104 and allows bonding to the dielectric layer 106. In this way, the epitaxial Ge layer 104 can be bonded to another wafer through the dielectric layer 106.

The dielectric layer 106 is typically an oxide film such as silicon dioxide ($SiO_2$), silicon nitride ($Si_3N_4$), hafnium oxide ($HfO_2$), strontium tintanate ($SrTiO_3$), tantalum penta oxide ($Ta_2O_5$), titanium oxide ($TiO_2$), zirconium oxide ($ZrO_2$), aluminum oxide ($Al_2O_3$), and yttrium oxide ($Y_2O_3$), etc. The dielectric layer 106 can be a high-k dielectric layer or a low-k dielectric layer. It is more preferable to have a high-k dielectric layer 106 for a thinner and more efficient insulation layer. The dielectric layer 106 is compatible to a semiconductor substrate, which it will be bonded to, e.g., a silicon substrate. The dielectric layer 106 is formed by a conventional method such as CVD or plasma enhanced CVD.

In one embodiment, the dielectric layer 106 is sufficiently thick to cover the roughness on the surface of the epitaxial Ge layer 104. In one embodiment, the dielectric layer 106 has a thickness 103 greater than 3000 Å. In another embodiment, the dielectric layer 106 has a thickness 103 greater than 6000 Å. Portions of the dielectric layer 106 may be removed (e.g., by polishing or etching) to provide the dielectric layer 106 with a smaller thickness (e.g., a thickness 107 as shown in FIG. 1F that is smaller than the thickness 103) if desired. In one embodiment, the thickness 103 is about 3000 Å and the thickness 107 is about 500-2000 Å. In one embodiment, the dielectric layer 106 is polished using a conventional method such as chemical mechanical polishing (CMP) to remove some of the dielectric layer 106.

In FIG. 1D, a second semiconductor substrate 110 is provided. The second semiconductor substrate 110 can be any suitable substrate typically used for fabricating an electronic device therein. The second semiconductor substrate 110 can be a Si wafer.

In FIG. 1E, the first semiconductor substrate 102 and the second semiconductor substrate 110 are bonded together. In particular, the first dielectric layer 106 is bonded to a surface of the second semiconductor substrate 110. After the bonding, the first dielectric layer 106 is buried between the second semiconductor substrate 110 and the epitaxial Ge layer 104.

A conventional bonding chamber can be used to bond the first semiconductor substrate 102 and the second semiconductor substrate 110 together. One embodiment of such conventional wafer-bonding chamber is the EVG 850 Series or the EVG 650 Series wafer bonders made by EV Group, Austria. An appropriate bonding condition for a wafer-bonding chamber is first obtained. The wafer-bonding chamber must be able to maintain the bonding temperature and bonding pressure. In one embodiment, the bonding temperature is obtained by heating up the wafer-bonding chamber to a desired bonding temperature, (e.g., a temperature ranging from 22° C. to 600° C.). In one embodiment, the bonding temperature is room temperature. In another embodiment, a chuck, which is used to hold the wafers, is heated up to the desired bonding temperature. The bonding pressure is obtained by evacuating the wafer-bonding chamber to a vacuum condition. The pressure of the wafer-bonding chamber can be obtained by using a conventional mechanical pump connected to the wafer-bonding chamber. The pressure of the wafer-bonding chamber is a pressure under which the mutual sticking of the Ge wafer to the Si wafer does not commence and that the Ge wafer and the Si wafer are held with respect to each other. In one embodiment, the pressure of the wafer-bonding chamber is below 1 Torr. In another embodiment, the pressure of the wafer-bonding chamber is about 1 mili Torr. In another embodiment, the pressure is atmospheric pressure.

The wafer-bonding chamber provides a clean and dry environment for the bonding to occur. In addition, prior bonding, the surface of the first dielectric layer 106 and the surface of the surface of the second semiconductor substrate 110 that is to be bonded to the first dielectric layer 106 are cleaned so that they have clean, substantially particle free, and atomically smooth surfaces to facilitate a good bonding. The present of small particles (e.g., particles having size larger than about 0.1-0.2 μm) would interrupt the bonding of the wafers and lead to void and decreasing bonding strength.

In one embodiment, a moisture containing carrier gas such as nitrogen, xenon and helium is introduced into the wafer-bonding chamber at a flow rate of about 10 ml-100 ml per minute to facilitate the bonding.

The bonding may occur with either the second semiconductor substrate 110 or the first semiconductor substrate 102 being on the bottom or being on top. In one embodiment, the second semiconductor substrate 110 is placed on the chuck in the bonding chamber and the first semiconductor substrate 102 is place on the top of the second semiconductor substrate 110 with the first dielectric layer 104 facing the second semiconductor substrate 110 for bonding.

A local force is applied either to the to the first semiconductor substrate 102 or the second semiconductor substrate 110 to initiate the bonding. In one embodiment, the local force is a force applied to one point either on the first semiconductor substrate 102 or the second semiconductor substrate 110. In another embodiment, the local force is applied to a region near an edge of either the first semiconductor substrate 102 or the second semiconductor substrate 110 using a Teflon pin conveying a force ranging from 3 Newton to 4000 Newton pressing down on that region. In a preferred embodiment, the local force is about 2000 Newton. Once the bonding is initiated, the bonding is propagated to completely bond the first dielectric layer 104 to the second semiconductor substrate 110. In one embodiment, the bonding is allowed to continue for an amount of time (e.g., 30 seconds or more) sufficient to completely bond the first dielectric layer 104 to the second semiconductor substrate 110 to form a bonded wafer pair.

After the bonding, the first semiconductor substrate 102 is removed using methods such as etching, grinding, and/or ion exfoliation. Ion exfoliation generally refers to a process that uses ion implantation to implant ions into a substrate such as the first semiconductor substrate 102, to a predetermined depth. The ions implanted form a cleaving plane at the predetermined depth within the substrate. The substrate can then be cleaved at the cleaving plane and be removed. After the first semiconductor substrate 102 is removed, the remaining structure forms the GOI substrate 100.

In one embodiment, prior to the removal of the first semiconductor substrate 102, the bonded wafer pair is annealed to strengthen the bonding interface and the bonding of the bonded wafer pair. The annealing process removes and diffuses any moisture trapped at the interface of the first dielectric layer 106 and the second semiconductor substrate 110. In one embodiment, the annealing process takes place in the same wafer-bonding chamber that is used for the bonding. The annealing process occurs at a temperature that is sufficient to strengthen the bonded wafer pair without causing damages to the bonded wafer pair. There are several ways for annealing the bonded wafer pair. In one embodiment, the bonded wafer pair is annealed at a temperature greater that 100° C. The annealing temperature can be as high as 600° C. or as high as 75% of the melting temperature of the wafers. In another embodiment, the bonded wafer pair is annealed in the presence of a carrier gas such as nitrogen and at a temperature of about 150° C. In one embodiment, the annealing temperature (e.g., 100-150° C.) is obtained with the temperature being ramped up to the annealing temperature at a rate of 1° C./minute while the bonded wafer pair resides in the chamber. After the annealing temperature is obtained, the bonded wafer pair is held in the chamber for a predetermined amount of time sufficient to anneal the bonded wafer pair, e.g., 1-20 hours. It is more advantageous to anneal the bonded wafer pair at a lower temperature and longer duration to prevent damages to the bonded wafer pair. The bonded wafer pair is then allowed to cool down with the temperature ramping down at a rate of approximately 1° C./minute to 2° C./minute. It is to be appreciated that the bonded wafer pair may be annealed using conventional annealing methods and that the annealing conditions recited above is only an exemplary condition and not a limitation.

In the embodiments where the bonded wafer pair is annealed, the first semiconductor substrate 102 is removed after the annealing to yield the GOI substrate 100. In the embodiments shown in FIGS. 1A-1E, the first semiconductor substrate 102 can be removed by grinding back (e.g., using CMP) to expose the epitaxial Ge layer 104. Alternatively, the first semiconductor substrate 102 can be removed by an etching process to expose the epitaxial Ge layer 104. Alternatively yet, the first semiconductor substrate 102 can be removed by a combination of a grind back and an etching processes. After the first semiconductor substrate 102 is removed, the GOI is formed having the epitaxial Ge layer 104 and the dielectric layer 106 bonded to the second semiconductor substrate 110.

In one embodiment, the first semiconductor substrate 102 is partially removed by a grind back process. The first semiconductor substrate 102 can then be polished using a CMP process to remove the majority of the first semiconductor substrate 102 from the bonded wafer pair. The first semiconductor substrate 102 can also be etched away using a chemistry that is selective to remove the substrate 102 to complete the removal process of the substrate 102.

FIGS. 2A-2F illustrate various stages of forming a GOI substrate 200 in accordance to some embodiments of the present invention. The GOI substrate 200 is similar to the GOI substrate 100 except that the second semiconductor substrate includes an additional dielectric layer.

In FIG. 2A, a first semiconductor substrate 202 is provided. The first semiconductor substrate 202 can be any suitable material that an epitaxial Ge layer can be formed thereon and be removed from. The semiconductor substrate 202 is typically a Si wafer.

In FIG. 2B, an epitaxial Ge layer 204 is formed on top of the first semiconductor substrate 202. In one embodiment, the epitaxial Ge layer 204 has a surface with a roughness approximately greater than 2 nm RMS. In another embodiment, the epitaxial Ge layer 204 has a surface with a roughness approximately greater than 4 nm RMS. The epitaxial Ge layer 204 has a thickness 201 that may be less than 3000 Å. In some embodiment, the epitaxial Ge layer 204 has a thickness 201 ranging from about 100-4000 Å. The epitaxial Ge layer 204 can be formed using conventional methods such as chemical vapor deposition (CVD) or plasma enhanced CVD as is known in the art.

In FIG. 2C, a first dielectric layer 206 is formed over the epitaxial Ge layer 204. As shown in FIG. 2B, the surface of the epitaxial Ge layer 204 is rough and thus difficult for a direct wafer bonding to the epitaxial Ge layer 204. Forming the first dielectric layer 206 over the epitaxial Ge layer 204 covers the rough surface on the epitaxial Ge layer 204 and allows bonding to the first dielectric layer 206. In this way, the epitaxial Ge layer 204 can be bonded to another wafer through the first dielectric layer 206. The first dielectric layer 206 is similar to the dielectric layer 106 previously described and can be an oxide film such as $SiO_2$, $Si_3N_4$, $HfO_2$, $SrTiO_3$, $Ta_2O_5$, $TiO_2$, $ZrO_2$, $Al_2O_3$, and $Y_2O_3$, etc.

The first dielectric layer 206 is formed by a conventional method such as CVD or plasma enhanced CVD.

In one embodiment, the first dielectric layer 206 is sufficiently thick to cover the roughness on the surface of the epitaxial Ge layer 204. In one embodiment, the first dielectric layer 206 has a thickness 203 greater than 3000 Å. In another embodiment, the first dielectric layer 206 has a thickness 203 greater than 6000 Å. Portions of the first dielectric layer 206 may be removed (e.g., by polishing or etching) to provide the first dielectric layer 206 with a smaller thickness (e.g., a thickness 207 as shown in FIG. 2F that is smaller than the thickness 203) if desired. In one embodiment, the thickness 203 is about 3000 Å and the thickness 207 is about 500-2000 Å. In one embodiment, the first dielectric layer 206 is polished using a conventional method such as chemical mechanical polishing (CMP) to remove some of the first dielectric layer 206.

In FIG. 2D, a second semiconductor substrate 210 is provided. The second semiconductor substrate 210 can be any suitable substrate typically used for fabricating an electronic device therein. The second semiconductor substrate 210 can be a Si wafer.

In FIG. 2E, a second dielectric layer 212 is formed on top of the second semiconductor substrate 210. The second dielectric layer 212 is similar to the first dielectric layer 206 and can be formed of similar material and using similar methods as those used for the first dielectric layer 206. The second dielectric layer 212 has a predetermined thickness 205. The second dielectric layer 212 and the first dielectric layer 206 should have a combined thickness 209 that is sufficient to insulate the device that will be formed on the GOI substrate 200. In one embodiment, the combined thickness 209 is between 500-3500 Å.

In FIG. 2F, the first semiconductor substrate 202 and the second semiconductor substrate 210 are bonded together. In particular, the first dielectric layer 206 is bonded to the second dielectric layer 212. After the first bonding, the first dielectric layer 206 and the second dielectric layer 212 are buried between the first semiconductor substrate 202 and the epitaxial Ge layer 204. The bonding condition and chamber are similar to the one used for form the GOI substrate 100 previously described. The first semiconductor substrate 202, the epitaxial Ge layer 204, the first dielectric layer 206, the second dielectric layer 212, and the second semiconductor substrate 210 form a bonded wafer pair after the bonding.

After the bonding, the first semiconductor substrate 202 is removed and the remaining structure forms the GOI substrate 200. In one embodiment, prior to the removal of the first semiconductor substrate 202, the bonded wafer pair is annealed using conventional methods or methods previously described to strengthen the bonding interface. In one embodiment, the first semiconductor substrate 202 is removed by grinding back (e.g., using CMP) to expose the epitaxial Ge layer 204. Alternatively, the first semiconductor substrate 202 is removed by an etching process to expose the epitaxial Ge layer 204. Alternatively yet, the first semiconductor substrate 202 can be removed by a combination of a grind back and an etching processes. The first semiconductor substrate 202 can also be removed similarly to the removal of the first semiconductor substrate 102 previously described. After the first semiconductor substrate 202 is removed, the GOI 200 is formed having the epitaxial Ge layer 204, the first and second dielectric layers 206 and 212 bonded to the second semiconductor substrate 210.

FIGS. 3A-3F illustrate various stages of forming a GOI substrate 300 in accordance with some embodiments of the present invention. The GOI substrate 300 is similar to the GOI substrate 100 and 200 except that the first semiconductor substrate includes a cleaving plane 311 for facilitate the removal of the first semiconductor substrate after the bonding. In addition, the second semiconductor substrate may optionally but need not include a second dielectric layer 312.

In FIG. 3A, a first semiconductor substrate 302 is provided. The first semiconductor substrate 302 can be any suitable material that an epitaxial Ge layer can be formed thereon and be removed from. The semiconductor substrate 302 is typically a Si wafer.

In FIG. 3B, an epitaxial Ge layer 304 is formed on top of the first semiconductor substrate 302. In one embodiment, the epitaxial Ge layer 304 has a surface with a roughness approximately greater than 2 nm RMS. In another embodiment, the epitaxial Ge layer 304 has a surface with a roughness approximately greater than 4 nm RMS. The epitaxial Ge layer 304 has a thickness 301 that may be less than 3000 Å. In some embodiment, the epitaxial Ge layer 304 has a thickness 301 ranging from about 100-4000 Å. The epitaxial Ge layer 304 can be formed using conventional methods such as chemical vapor deposition (CVD) or plasma enhanced CVD as is known in the art.

In FIG. 3C, a first dielectric layer 306 is formed over the epitaxial Ge layer 304. As shown in FIG. 3B, the surface of the epitaxial Ge layer 304 is rough and thus difficult for a direct wafer bonding to the epitaxial Ge layer 304. Forming the first dielectric layer 306 over the epitaxial Ge layer 304 covers the rough surface on the epitaxial Ge layer 304 and allows bonding to the first dielectric layer 306. In this way, the epitaxial Ge layer 304 can be bonded to another wafer through the first dielectric layer 306. The first dielectric layer 306 is similar to the dielectric layer 106 previously described and can be an oxide film such as $SiO_3$, $Si_3N_4$, $HfO_3$, $SrTiO_3$, $Ta_3O_5$, $TiO_3$, $ZrO_3$, $Al_3O_3$, and $Y_3O_3$, etc. The first dielectric layer 306 is formed by a conventional method such as CVD or plasma enhanced CVD.

In one embodiment, the first dielectric layer 306 is sufficiently thick to cover the roughness on the surface of the epitaxial Ge layer 304. In one embodiment, the first dielectric layer 306 has a thickness 303 greater than 3000 Å. In another embodiment, the first dielectric layer 306 has a thickness 303 greater than 6000 Å.

In FIG. 3C, ion implantation 320 is used to bombard ions (e.g., hydrogen ion) into the first semiconductor substrate 302. The ion implantation 320 creates a cleaving plane 311 that later facilitates the removal of the first semiconductor substrate 302 after bonding. The cleaving plane 311 can be created at a location that is convenient for the removal of the first semiconductor substrate 302 after the bonding. In one embodiment, the ion implantation 320 bombards ions into the first semiconductor substrate 302 at a location near the interface 313 between the epitaxial Ge layer 204 and the first semiconductor substrate 302. The ion implantation 320 may be deeper into the first semiconductor substrate 302 if desired. In one embodiment, a conventional ion implantation process is used to implant energetic particles or ions (e.g., hydrogen particles, $H_2^+$ or $H^+$) through the top surface of the first dielectric layer 306 to a predetermined depth in the first semiconductor substrate 302. The cleaving plane is parallel or substantially parallel to the surface of the first dielectric layer 306. In one embodiment, the ions are implanted to a dosage of about $5 \times 10^{16}$ to $5 \times 10^{18}$, or $1 \times 10^{17}$. A smoothing process can be used after the first semiconductor substrate 302 is cleaved off to smooth out the surface for the epitaxial Ge layer 304.

In one embodiment, portions of the first dielectric layer 306 are removed (e.g., by polishing or etching) to provide the first dielectric layer 306 with a smooth, substantially particle free., and clean surface (to repair any damages caused by the ion implantation). A smooth surface will facilitate the bonding of the first dielectric layer 306 to another surface. In addition, the first dielectric layer 306 may be thinned to a desired thickness in the removal process. For some embodiments, the first dielectric layer 306 may be thinned from the thickness 303 to a thickness 307 shown in FIG. 3F that is smaller than the thickness 303. In one embodiment, the thickness 303 is about 3000 Å and the thickness 307 is about 500-2000 Å. In one embodiment, the first dielectric layer 306 is polished using a conventional method such as chemical mechanical polishing (CMP) to remove some of the first dielectric layer 306.

In FIG. 3D, a second semiconductor substrate 310 is provided. The second semiconductor substrate 310 can be any suitable substrate typically used for fabricating an electronic device therein. The second semiconductor substrate 310 can be a Si wafer.

In FIG. 3E, a second dielectric layer 312 is formed on top of the second semiconductor substrate 310. The second dielectric layer 312 is similar to the first dielectric layer 306 and can be formed of similar material and using similar methods as those used for the first dielectric layer 306. The second dielectric layer 312 has a predetermined thickness 305. The second dielectric layer 312 and the first dielectric layer 306 should have a combined thickness 309 that is sufficient to insulate the device that will be formed on the GOI substrate 300. In one embodiment, the combined thickness 309 is between 500-3500 Å.

In FIG. 3F, the first semiconductor substrate 302 and the second semiconductor substrate 310 are bonded together. In particular, the first dielectric layer 306 is bonded to the second dielectric layer 312. After the bonding, the first dielectric layer 306 and the second dielectric layer 312 are buried between the first semiconductor substrate 302 and the epitaxial Ge layer 304. The bonding condition and chamber are similar to the one used for form the GOI substrate 100 previously described. The first semiconductor substrate 302, the epitaxial Ge layer 304, the first dielectric layer 304, the second dielectric layer 312, and the second semiconductor substrate 310 form a bonded wafer pair after the bonding. After the bonding, the first semiconductor substrate 302 is removed and the remaining structure is the GOI substrate 300.

In one embodiment, prior to the removal of the first semiconductor substrate 302, the bonded wafer pair is annealed using conventional methods or methods previously described to strengthen the bonding interface. In one embodiment, the first semiconductor substrate 302 is removed a nitrogen jet to initiate the cleaving of the first semiconductor substrate 302 at the cleaving plane 311. Alternatively, the first semiconductor substrate 302 is removed by an annealing process to thermally cleave the first semiconductor substrate 302 at the cleaving plane 311. The annealing process used to thermally cleave the first semiconductor substrate 302 can be similar to the annealing process used to strengthen the bonding of the bonded wafer pair. The annealing process used to thermally cleave the first semiconductor substrate 302 typically occurs at a temperature that is sufficient to initiate the cleaving of the first semiconductor substrate 302. The cleaving temperature ranges from 100° C. to 600° C. In one embodiment, the cleaving temperature is approximately 150° C. for ion implantation that creates a cleaving plane within the epitaxial Ge layer 304. In another embodiment, the cleaving temperature is approximately 450° C. for ion implantation that creates a cleaving plane within the first semiconductor substrate 302.

The removal of the first semiconductor substrate 302 exposes the epitaxial Ge layer 304. After the first semiconductor substrate 302 is removed, the GOI 300 is formed having the epitaxial Ge layer 304, the first and second dielectric layers 306 and 312 bonded to the second semiconductor substrate 310.

In one embodiment, after cleaving, the epitaxial Ge layer 304 may have a rough surface on the side where the first semiconductor substrate 302 was removed. The epitaxial Ge layer 304 may be polished (and if needed, further thinned) using a chemical mechanical polishing (CMP), a wet chemical treatment, or wet/dry etching method well known in the art. In one embodiment, a conventional CMP tool is used to polish and/or to repair any surface damage and/or roughness in the epitaxial Ge layer 304.

FIG. 4 illustrates an exemplary embodiment of a method 400 of forming a GOI substrate (e.g., the GOI substrate 100). At operation 402, an epitaxial Ge layer is formed on top of a first semiconductor substrate, which may be a Si wafer. At operation 404, a first dielectric film (e.g., an oxide or a nitride film) is formed on top of the epitaxial Ge layer. At operation 606, a second semiconductor substrate is provided. The second semiconductor substrate may have a second dielectric film formed on top of the second semiconductor substrate. At operation 608, the first semiconductor substrate is bonded to the second semiconductor substrate in such a way that the first dielectric film is bonded to the second semiconductor substrate or alternatively, the first dielectric film is bonded to the second dielectric film. At operation 610, the first semiconductor substrate is removed to expose the epitaxial Ge layer, e.g., by using a grind back and/or an etching process.

Figure 5:
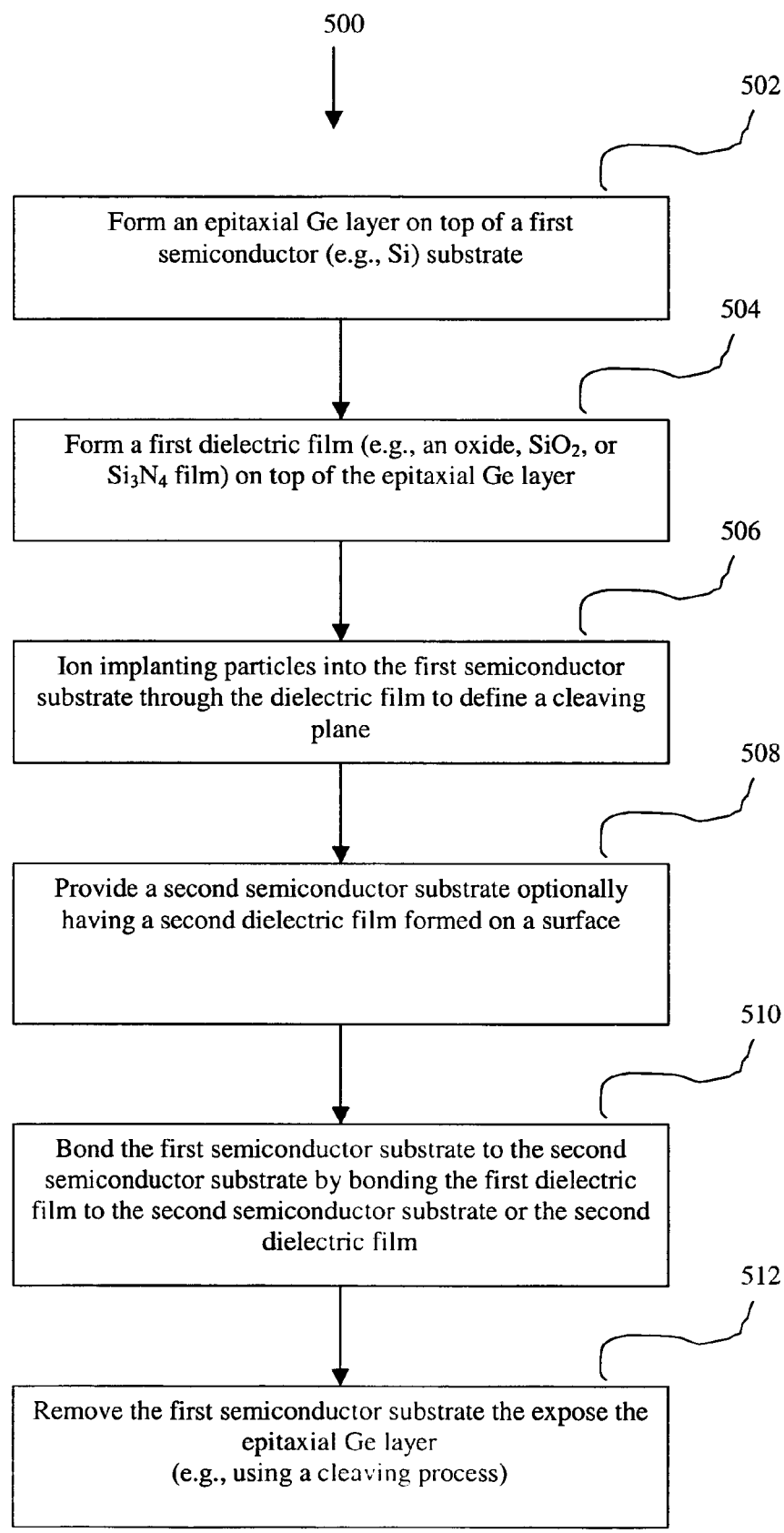
FIG. 5 illustrates another exemplary method of bonding an epitaxial Ge layer to a semiconductor substrate wafer in accordance to the embodiments of the present invention.

FIG. 5 illustrates another exemplary method 500 of forming a GOI substrate (e.g., the GOI substrate 300). At operation 502, an epitaxial Ge layer is formed on top of a first semiconductor substrate, which may be a Si wafer. At operation 504, a first dielectric film (e.g., an oxide or a nitride film) is formed on top of the epitaxial Ge layer. At operation 506, ion implantation is used to implant particles into the first semiconductor substrate. In one embodiment, the ions are implanted into the first semiconductor substrate using hydrogen implantation. The ion implantation creates a cleaving plane within the first semiconductor substrate.

At operation 508, a second semiconductor substrate is provided. The second semiconductor substrate may have a second dielectric film formed on top of the second semiconductor substrate. At operation 510, the first semiconductor substrate is bonded to the second semiconductor substrate in such a way that the first dielectric film is bonded to the second semiconductor substrate or alternatively, the first dielectric film is bonded to the second dielectric film. At operation 512, the first semiconductor substrate is removed to expose the epitaxial Ge layer, e.g., by using a thermal cleaving process or jetting process.

Figure 6:
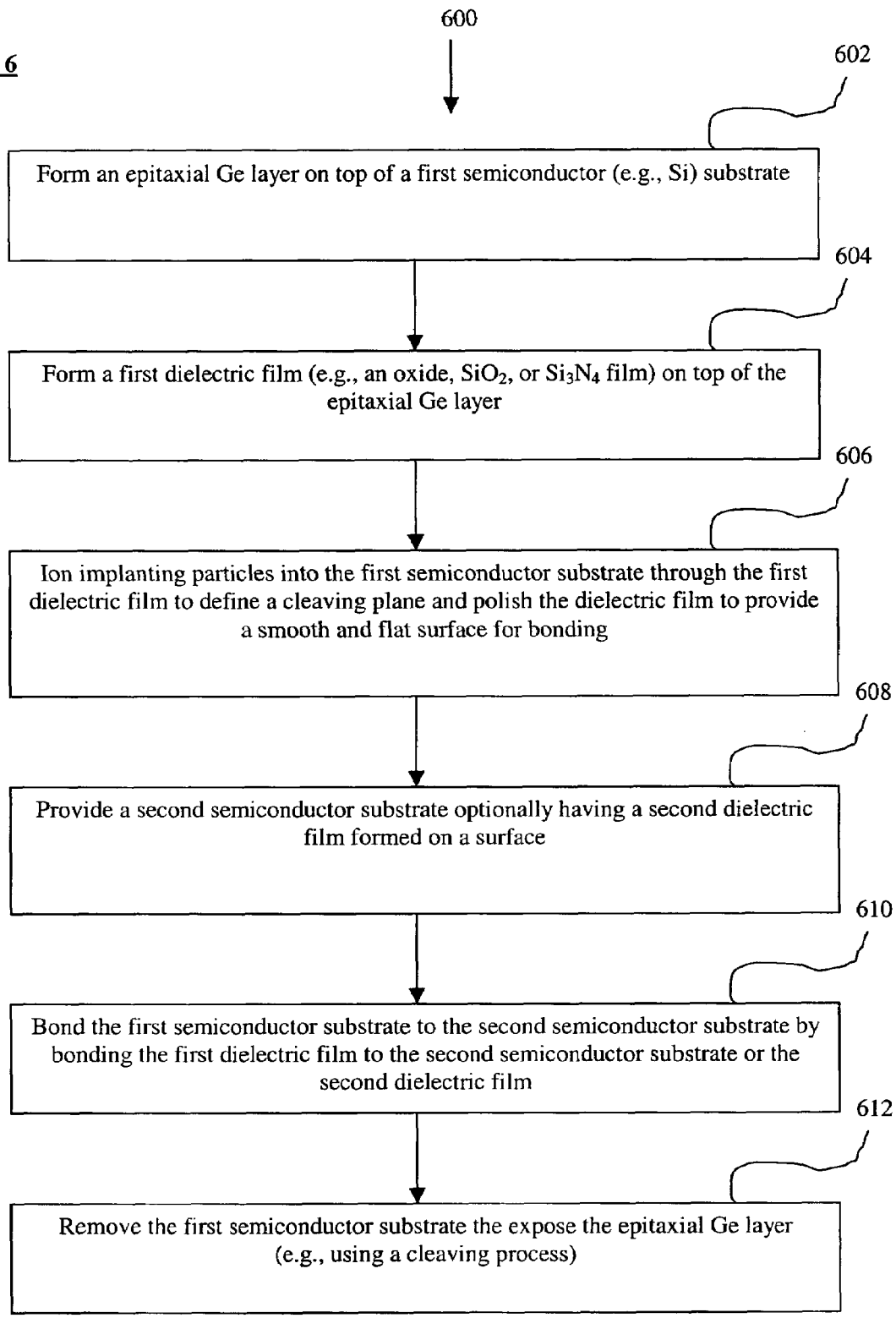
FIG. 6 illustrates yet another exemplary method of bonding an epitaxial Ge layer to a semiconductor substrate wafer in accordance to the embodiments of the present invention.

FIG. 6 illustrates another exemplary method 600 of forming a GOI substrate (e.g., the GOI substrate 300). At operation 602, an epitaxial Ge layer is formed on top of a first semiconductor substrate, which may be a Si wafer. At operation 604, a first dielectric film (e.g., an oxide or a nitride film) is formed on top of the epitaxial Ge layer. At operation 606, ion implantation is used to implant particles into the first semiconductor substrate. In one embodiment, the ions are implanted into the first semiconductor substrate using hydrogen implantation. The ion implantation creates a cleaving plane within the first semiconductor substrate. In addition, the first dielectric layer is polished (e.g., using CMP or etching) to provide a smooth and/or flat surface for bonding. The polishing process occurs after the ion implantation to repair any damages to the surface of the first dielectric layer.

At operation 608, a second semiconductor substrate is provided. The second semiconductor substrate may have a second dielectric film formed on top of the second semiconductor substrate. At operation 610, the first semiconductor substrate is bonded to the second semiconductor substrate in such a way that the first dielectric film is bonded to the second semiconductor substrate or alternatively, the first dielectric film is bonded to the second dielectric film. At operation 612, the first semiconductor substrate is removed to expose the epitaxial Ge layer, e.g., by using a thermal cleaving process or jetting process.

Figure 7:
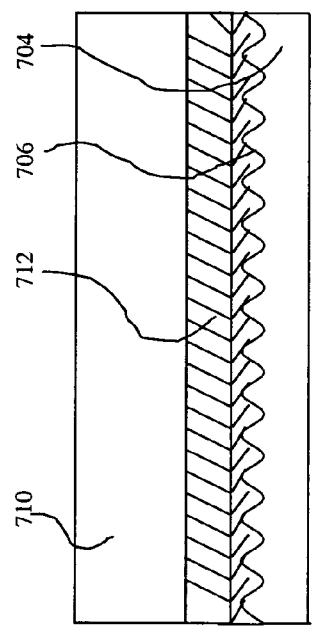
FIG. 7 illustrates a GOI substrate formed in accordance to some embodiments of the present invention.

FIG. 7 illustrates an exemplary GOI substrate 700 formed in accordance to some of the embodiments of the present invention. The GOI substrate 700 can be the GOI substrate 100, 200, 300, or 400 previously described. The GOI substrate 700 includes a semiconductor substrate 710, which is bonded to a dielectric layer 712 and a dielectric 706. The dielectric layer 706 is formed over an epitaxial Ge layer 704 as previously described. In certain embodiments, the dielectric layer 712 is eliminated and only the dielectric layer 706 is present and bonded to the semiconductor substrate 710 as previously described.

Figure 8:
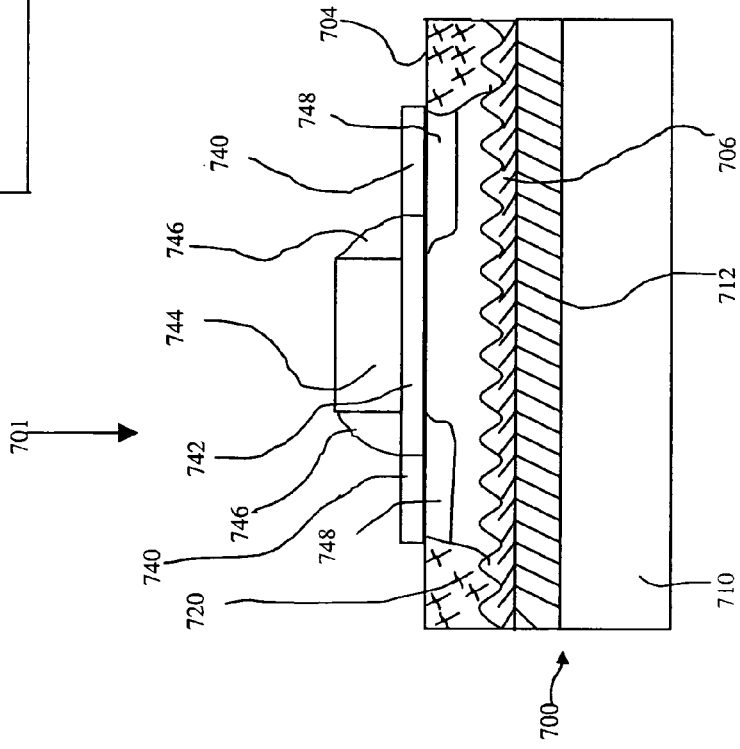
FIG. 8 illustrates an exemplary semiconductor device (e.g., a transistor) that can he fabricated in a GOI substrate formed in accordance to some of the embodiments of the present invention.

FIG. 8 illustrates an exemplary semiconductor device 701 fabricated in the GOI substrate 700. In one embodiment, the semiconductor device 701 is a transistor. The semiconductor device 701 includes the GOI substrate 700, isolation trenches 720, source drain regions 748, a gate dielectric 742, a gate electrode 744, spacers 746, and optionally, source/drain contacts 700.

In one embodiment, the epitaxial Ge layer 704 of the GOI substrate 700 may be moderately doped (e.g., $1 \times 10^{16}$ per $cm^3$ to $1 \times 10^{15}$ per $cm^3$). The doping concentration is chosen to properly target the transistor threshold voltage. Isolation trenches 720 may be formed into the Ge layer 704 using conventional methods (e.g., etching). The gate dielectric 742, gate electrode 744, and spacers 746 can be formed on the top surface of the Ge layer 704 using conventional methods (e.g., film deposition and patterning). In one embodiment, the gate dielectric 742 is made out of a high-k dielectric material. The gate electrode 744 can be made out of a metal containing material, such as titanium nitride or tungsten, for a metal gate. The gate electrode 744 can also be doped polysilicon. The spacers 746, typically comprise of a combination of $SiO_2$ and $Si_3N_4$. The source and drain regions 748 are formed in the Ge layer 704 using conventional methods. The source and drain regions 748 may be heavily doped with a dopant concentration of $1 \times 10^{20}$ per $cm^3$.

Source/drain contacts 740 can be made of nickel-germanium (NiGe) and formed on the Ge layer 704 over the regions that are not covered by the gate dielectric 742 and the spacers 746. In one embodiment, the NiGe is formed by a low-temperature annealing method using an annealing temperature of about 400° C. to 600° C. Depositing a metal (e.g., nickel) that reacts with the material in the transistor body can substantially lower the resistivity of the source and drain contacts. Conventional contacts can also be formed instead to establish contacts to the source/drain regions 748.

Those skilled in the art will recognize that the features mentioned in FIG. 5 and other features may be used or may be left out, depending upon the particular function of the device 701. For some embodiments, after the formation of the NiGe, the device 701 is subjected to convention process of forming interlayer dielectric deposition, contact patterning, metalization, etc.

Figure 9:
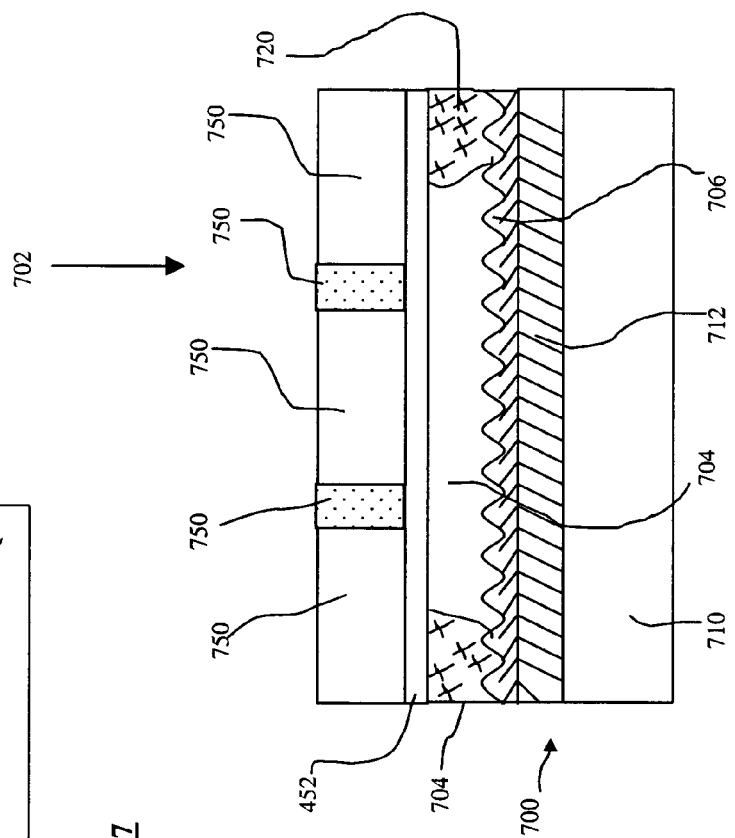
FIG. 9 illustrates another exemplary semiconductor device (e.g., a detector) that can be fabricated in a GOI substrate formed in accordance to some of the embodiments of the present invention.

FIG. 9 illustrates another exemplary semiconductor device 702 that can be fabricated in the GOI substrate 700. The exemplary semiconductor device 702 is an integrated detector that may provide electrical output driven by an optical input to integrated circuits in a substrate. The device 702 includes the GOI substrate 700 having the epitaxial Ge layer 704. Isolation trenches 720 are formed into the epitaxial Ge layer 704 using conventional methods. The device 702 further includes a waveguide 752 formed on top of the epitaxial Ge layer 704 using conventional methods. The waveguide 752 is further encapsulated by a dielectric layer 750. It is common for the integrated structure to have the waveguide 752 be made out of a relatively high-refractive index material (e.g., $Si_3N_4$ which has a refractive index n=2.05). The waveguide 752 is typically encapsulated in a material with lower refractive index (e.g., $SiO_2$ which has a refractive index n=1.46). When light is introduced in the waveguide 752 having the high refractive index material, the light will be confined there. The waveguide 752 then "guides" the light from the source (typically an external laser) to the detector (in this case, the Ge layer 704).

Detector electrodes 754 are formed in vias created in the dielectric layer 750. In order for the Ge layer 704 to function as a detector, a bias must be applied across it. Any light shining on the detector then generates electron-hole pairs. These pairs are swept by the bias field, causing current to flow through the Ge layer 704. There is an electrical response to a light impulse. The detector electrodes 754 are needed to provide the required bias. In one embodiment, a conductive material, such as metal, is deposited and then patterned using conventional methods. In this embodiment, the detector electrodes 754 are deposited by a damascene process, well practiced in the field.

While the invention has been described in terms of several embodiments, those of ordinary skill in the art will recognize that the invention is not limited to the embodiments described. The method and apparatus of the invention, but can be practiced with modification and alteration within the spirit and scope of the appended claims. The description is thus to be regarded as illustrative instead of limiting.

Having disclosed exemplary embodiments, modifications and variations may be made to the disclosed embodiments while remaining within the spirit and scope of the invention as defined by the appended claims.

We claim:

1. A method of forming a germanium-on-insulator (GOI) substrate comprising:
    forming an epitaxial germanium layer on top of a first substrate;
    forming a first dielectric film to a thickness greater than 3000 Å on top of the epitaxial germanium layer;
    providing a second semiconductor substrate comprising a semiconductor surface;
    bonding the first substrate directly to the second substrate by bonding the first dielectric film to the semiconductor surface of the second substrate, the bonding resulted in a bonded wafer pair; and
    removing the first substrate after the bonding to expose epitaxial germanium layer to form the GOI substrate.

2. A method as in claim 1 wherein the removing of the first substrate after the bonding includes one of a grind back process, an etching process, and an ion exfoliation process.

3. A method as in claim 1 further comprising:
polishing the surface of the first dielectric film prior to the bonding.

4. A method as in claim 1 wherein the removing of the first substrate after the bonding includes cleaving off the first substrate.

5. A method as in claim 1 wherein each of the first substrate and the second substrate semiconductor wafer is selected from a group consisting of a silicon (Si) substrate, a monocrystalline Si substrate, a polycrystalline Si substrate, a Si-containing substrate, a Si substrate having an oxide layer, a silicon-on-insulator (SOI) substrate, a gallium arsenide substrate, and Ge-containing substrate.

6. A method as in claim 1 further comprising causing a surface activation to the top surface of the first dielectric film and at least one surface of the second substrate to facilitate the bonding.

7. A method as in claim 1 further comprises annealing the bonded wafer pair at a predetermined annealing temperature, wherein the annealing temperature is achieved with a temperature ramp rate of approximately 1° C./minute.

8. A method of bonding a germanium layer having a rough surface to a substrate comprising:
forming an epitaxial germanium layer on top of a first substrate, the epitaxial germanium layer having a rough surface, the rough surface has a roughness value approximately greater than 2 nm RMS;
forming a first dielectric film to a thickness greater than 3000 Å on top of the rough surface;
bonding the first dielectric film directly to a semiconductor surface of a second semiconductor substrate, the bonding resulted in a bonded wafer pair wherein the first dielectric film is located between the epitaxial germanium layer and the second substrate; and
removing the first substrate after the bonding to expose epitaxial germanium layer.

9. A method as in claim 8 wherein the removing of the first substrate after the bonding includes one of a grind back process, an etching process, and an ion exfoliation process.

10. A method as in claim 8 further comprising:
polishing the surface of the first dielectric film prior to the bonding.

11. A method as in claim 8 wherein each of the first substrate and the second substrate semiconductor wafer is selected from a group consisting of a silicon (Si) substrate, a monocrystalline Si substrate, a polycrystalline Si substrate, a Si-containing substrate, a Si substrate having an oxide layer, a silicon-on-insulator (SOI) substrate, a gallium arsenide substrate, and Ge-containing substrate.

12. A method as in claim 8 further comprising causing a surface activation to the top surface of the first dielectric film and at least one surface of the second substrate to facilitate the bonding.

13. A method as in claim 8 further comprises annealing the bonded wafer pair at a predetermined annealing temperature, wherein the annealing temperature is achieved with a temperature ramp rate of approximately 1° C./minute.

14. A method of fabricating a semiconductor device comprising:
forming an epitaxial germanium layer on top of a first substrate;
forming a first dielectric film to a thickness greater than 3000 Å on top of the epitaxial germanium layer;
providing a second semiconductor substrate comprising a semiconductor surface;
bonding the first substrate directly to the semiconductor surface of the second substrate by bonding the first dielectric film to the second substrate, the bonding resulted in a bonded wafer pair;
removing the first substrate after the bonding to expose epitaxial germanium layer to form a GOI substrate; and
forming an electronic device on the GOI substrate.

15. A method as in claim 14 wherein the electronic device includes one of a transistor and a detector.

16. A method as in claim 15 wherein the transistor includes a gate dielectric, a gate electrode, spacers and source/drain regions.

17. A method as in claim 15 wherein the detector includes a waveguide encapsulated by an oxide layer and at least one electrode.

18. A method as in claim 14 wherein the removing of the first substrate after the bonding includes one of a grind back process, an etching process, and an ion exfoliation process.

19. A method as in claim 14 further comprising:
polishing the surface of the first dielectric film prior to the bonding.

20. A method as in claim 14 wherein the removing of the first substrate after the bonding includes cleaving off the first substrate.

21. A method of forming a germanium-on-insulator (GOI) substrate comprising:
forming an epitaxial germanium layer on top of a first substrate, the epitaxial germanium layer having a surface roughness;
forming a first dielectric film on top of the epitaxial germanium layer, to a thickness greater than 3000 Å
polishing the surface of the first dielectric film;
providing a second substrate;
bonding the first substrate to the second substrate by bonding the first dielectric film to the second substrate, the bonding resulted in a bonded wafer pair; and
removing the first substrate after the bonding to expose epitaxial germanium layer to form the GOI substrate.

22. A method as in claim 21 wherein the removing of the first substrate after the bonding includes one of a grind back process, an etching process, and an ion exfoliation process.

23. A method as in claim 21 wherein the removing of the first substrate after the bonding includes cleaving off the first substrate.

24. A method as in claim 21 wherein each of the first substrate and the second substrate semiconductor wafer is selected from a group consisting of a silicon (Si) substrate, a monocrystalline Si substrate, a polycrystalline Si substrate, a Si-containing substrate, a Si substrate having an oxide layer, a silicon-on-insulator (SOI) substrate, a gallium arsenide substrate, and Ge-containing substrate.

25. A method as in claim 21 further comprising causing a surface activation to the top surface of the first dielectric film and at least one surface of the second substrate to facilitate the bonding.

26. A method as in claim 21 further comprises annealing the bonded wafer pair at a predetermined annealing temperature, wherein the annealing temperature is achieved with a temperature ramp rate of approximately 1° C./minute.

27. A method of bonding a germanium layer having a rough surface to a substrate comprising:
forming an epitaxial germanium layer on top of a first substrate, the epitaxial germanium layer having a rough surface, the rough surface has a roughness value approximately greater than 2 nm RMS;
forming a first dielectric film to a thickness greater than 3000 Å on top of the rough surface,
polishing the surface of the first dielectric film;

bonding the polished first dielectric film to a second substrate, the bonding resulted in a bonded wafer pair wherein the first dielectric film is located between the epitaxial germanium layer and the second substrate; and removing the first substrate after the bonding to expose epitaxial germanium layer.

28. A method as in claim 27 wherein the removing of the first substrate after the bonding includes one of a grind back process, an etching process, and an ion exfoliation process.

29. A method as in claim 27 wherein each of the first substrate and the second substrate semiconductor wafer is selected from a group consisting of a silicon (Si) substrate, a monocrystalline Si substrate, a polycrystalline Si substrate, a Si-containing substrate, a Si substrate having an oxide layer, a silicon-on-insulator (SOI) substrate, a gallium arsenide substrate, and Ge-containing substrate.

30. A method as in claim 27 further comprising causing a surface activation to the top surface of the first dielectric film and at least one surface of the second substrate to facilitate the bonding.

31. A method as in claim 27 further comprises annealing the bonded wafer pair at a predetermined annealing temperature, wherein the annealing temperature is achieved with a temperature ramp rate of approximately 1° C./minute.

32. A method of fabricating a semiconductor device comprising:

forming an epitaxial germanium layer on top of a first substrate, the epitaxial germanium layer having a surface roughness;

forming a first dielectric film on top of the epitaxial germanium layer, to a thickness greater than 3000 Å polishing the surface of the first dielectric film;

providing a second substrate;

bonding the first substrate to the second substrate by bonding the first dielectric film to the second substrate, the bonding resulted in a bonded wafer pair;

removing the first substrate after the bonding to expose epitaxial germanium layer to form a GOI substrate; and forming an electronic device on the GOI substrate.

33. A method as in claim 32 wherein the electronic device includes one of a transistor and a detector.

34. A method as in claim 33 wherein the transistor includes a gate dielectric, a gate electrode, spacers and source/drain regions.

35. A method as in claim 33 wherein the detector includes a waveguide encapsulated by an oxide layer and at least one electrode.

36. A method as in claim 32 wherein the removing of the first substrate after the bonding includes one of a grind back process, an etching process, and an ion exfoliation process.

37. A method as in claim 32 wherein the removing of the first substrate after the bonding includes cleaving off the first substrate.

* * * * *